United States Patent
Basceri et al.

(10) Patent No.: US 6,785,120 B1
(45) Date of Patent: Aug. 31, 2004

(54) METHODS OF FORMING HAFNIUM-CONTAINING MATERIALS, METHODS OF FORMING HAFNIUM OXIDE, AND CAPACITOR CONSTRUCTIONS COMPRISING HAFNIUM OXIDE

(75) Inventors: Cem Basceri, Boise, ID (US); F. Daniel Gealy, Kuna, ID (US); Gurtej S. Sandhu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/613,191

(22) Filed: Jul. 3, 2003

(51) Int. Cl.$^7$ ................................................ H01G 4/06
(52) U.S. Cl. ..................... 361/311; 361/306.1; 438/240; 257/303
(58) Field of Search .............................. 361/306.3, 311, 361/312, 313, 329; 438/240, 244, 250, 251; 257/303, 306, 301, 310

(56) References Cited

U.S. PATENT DOCUMENTS 4,490,193 A * 12/1984 Ishaq et al. ................ 438/558
5,821,556 A * 10/1998 Chew et al. ................ 257/31
6,537,830 B1 * 3/2003 Arita et al. ................. 438/3

* cited by examiner

*Primary Examiner*—Anthony Dinkins
(74) *Attorney, Agent, or Firm*—Wells St. John P.S.

(57) ABSTRACT

The invention includes methods of forming hafnium-containing materials, such as, for example, hafnium oxide. In one aspect, a semiconductor substrate is provided, and first reaction conditions are utilized to form hafnium-containing seed material in a desired crystalline phase and orientation over the substrate. Subsequently, second reaction conditions are utilized to grow second hafnium-containing material over the seed material. The second hafnium-containing material is in a crystalline phase and/or orientation different from the crystalline phase and orientation of the hafnium-containing seed material. The second hafnium-containing material can be, for example, in an amorphous phase. The seed material is then utilized to induce a desired crystalline phase and orientation in the second hafnium-containing material. The invention also includes capacitor constructions utilizing hafnium-containing materials, and circuit assemblies comprising the capacitor constructions.

61 Claims, 4 Drawing Sheets

METHODS OF FORMING HAFNIUM-CONTAINING MATERIALS, METHODS OF FORMING HAFNIUM OXIDE, AND CAPACITOR CONSTRUCTIONS COMPRISING HAFNIUM OXIDE

TECHNICAL FIELD

The invention pertains to methods of forming hafnium-containing materials, such as, for example, hafnium oxide. The invention also pertains to capacitor constructions comprising hafnium oxide.

BACKGROUND OF THE INVENTION

Hafnium oxide can have appropriate physical properties to be useful as a dielectric material in integrated circuitry. Specifically, if hafnium oxide has a tetragonal (also referred to as tetraclinic) crystallographic orientation, or an orthorhombic crystallographic orientation, it can have appropriate permittivity and low leakage to be suitable for utilization as a dielectric material in numerous circuit devices, such as, for example, capacitor constructions. However, if the hafnium oxide is in a monoclinic crystallographic orientation, the hafnium oxide can have a leakage current which is too high to be suitable for utilization in integrated circuit devices. The leakage of monoclinic hafnium oxide is typically about $10^{-7}$ amps/cm$^2$, while the leakage of tetragonal and orthorhombic hafnium oxide is typically about $10^{-9}$ amps/cm$^2$.

It would be desirable to develop methods by which hafnium oxide can be cost-effectively and reliably formed in a non-monoclinic crystallographic orientation (such as, for example, a tetragonal or orthorhombic crystallographic orientation). It would be further desirable if such methodology could be extended to other hafnium-containing materials besides hafnium oxide. Additionally, it would be desirable for the methodology to be extendable to integrated circuit device fabrication processes.

SUMMARY OF THE INVENTION

In one aspect, the invention pertains to methods of forming hafnium-containing materials. A semiconductor substrate is provided. First reaction conditions are utilized to form hafnium-containing seed material in a desired crystallographic orientation over the substrate. Subsequently, second reaction conditions are utilized to grow second hafnium-containing material over the seed material. The second hafnium-containing material is in a phase and/or crystallographic orientation different from the hafnium-containing seed material. The second hafnium-containing material can be, for example, in an amorphous phase. The seed material is then utilized to induce a desired crystallographic orientation in the second hafnium-containing material.

In one aspect, the invention pertains to a method of forming hafnium oxide. A first hafnium oxide-containing material is formed over a substrate, with the first hafnium oxide-containing material being predominately in a crystalline phase having a tetragonal orientation. A second hafnium oxide-containing material is formed over the first hafnium oxide-containing material, with the second hafnium oxide-containing material being in a substantially amorphous phase. The first hafnium oxide-containing material is then utilized to induce the crystalline phase having the tetragonal orientation in the second hafnium oxide-containing material.

In one aspect, the invention includes a capacitor construction. The construction includes a semiconductor substrate, and a first capacitor electrode over the substrate. A dielectric material is over the first capacitor electrode, and a second capacitor electrode is over the dielectric material. An entirety of the dielectric material between the first and second electrodes consists essentially of hafnium oxide in a crystalline phase and having a non-monoclinic crystallographic orientation. In particular aspects, the hafnium oxide can have a tetragonal crystallographic orientation. The capacitor construction can be utilized in, for example, DRAM constructions, and such constructions can be incorporated into electronic systems.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention includes methodology for forming hafnium-containing materials in which the materials are deposited in at least two steps. In particular aspects, the invention pertains to methods of depositing hafnium oxide. A hafnium oxide-containing seed material is initially deposited in a desired crystalline phase and orientation. For purposes of interpreting this disclosure and the claims that follow, the term "crystalline phase" refers to the amount of crystallinity of a material, and specifically refers to the relative amount of crystalline structure and amorphous structure within the material. The term "crystallographic orientation" refers to the unit cell characteristics of a crystalline material. A material is "predominately in a stated crystallographic orientation" if more than 50 volume percent of the material is in the stated crystallographic orientation; "substantially entirely in a stated crystallographic orientation" if at least 95 volume percent of the material is in the stated crystallographic orientation; and "entirely in a stated crystallographic orientation" if there is no detectable crystallographic orientation other than the stated crystallographic orientation, or in other words, if about 100 volume percent of the material is in the stated crystallographic orientation.

After the seed material is deposited, a second hafnium oxide-containing material is deposited over the seed material. The second hafnium oxide-containing material is in a different crystalline phase and/or orientation than the seed material. If the difference between the second hafnium oxide-containing material and the seed material is in the crystalline phase, it will be a difference in a degree of crystallinity (specifically, the second hafnium oxide-containing material can be substantially entirely amorphous, while the seed material is substantially entirely crystalline). If the difference between the second hafnium oxide-containing material and the seed material is in the crystallographic orientation, both the second hafnium oxide-containing material and the seed material will comprise crystalline structures, and the second hafnium oxide-containing material will have a different crystalline structure than the seed material (for instance, the second hafnium oxide-containing material can be predominately monoclinic in crystallographic orientation while the seed material is predominately tetragonal in crystallographic orientation).

The seed material is utilized to induce desired crystalline properties (i.e., to induce one or both of a desired crystalline phase and orientation) in the second hafnium oxide-containing material.

A problem with prior art methods of forming hafnium oxide is that the methods tend to either deposit a leaky form of hafnium oxide (i.e., hafnium oxide in a monoclinic crystallographic orientation), or to be very slow. The present invention can form hafnium oxide-containing materials in a desired non-leaky crystallographic orientation, with increased throughput relative to prior art processes. Further, methodology of the present invention can be extended to other hafnium-containing materials, such as, for example, hafnium nitride.

An exemplary process of the present invention is described with reference to FIGS. 1–4.

Figure 1:
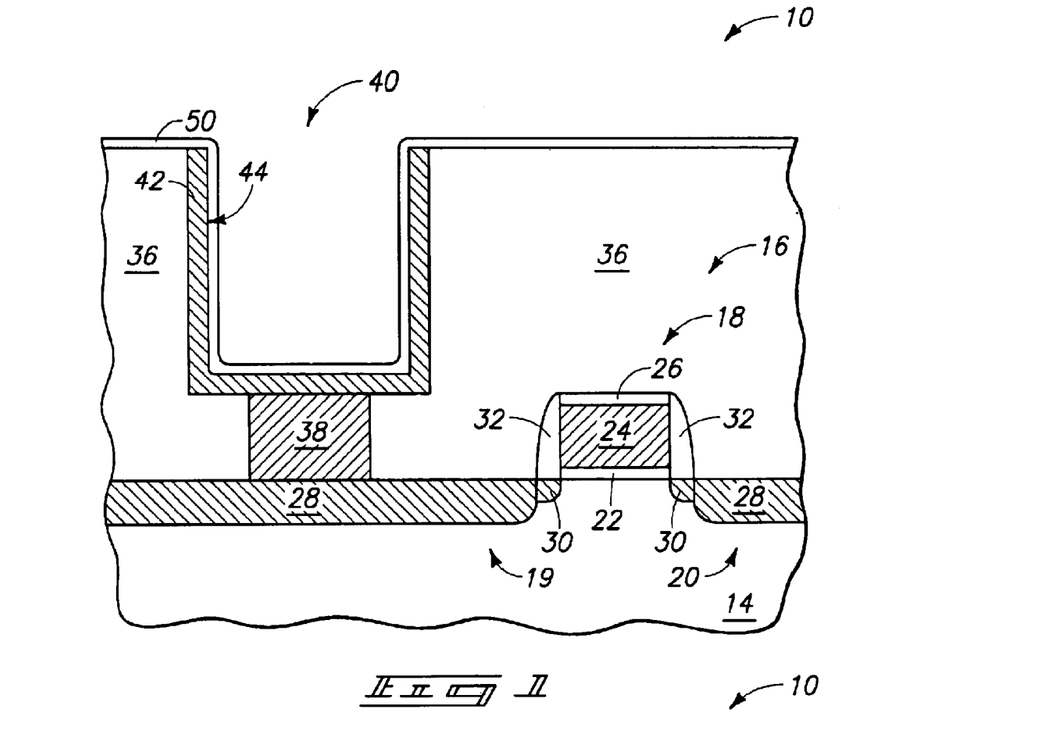
FIG. 1 is a diagrammatic, cross-sectional view of a semiconductor wafer fragment shown at a preliminary processing stage of an exemplary method of the present invention.

Referring initially to FIG. 1, a semiconductor wafer fragment 10 is illustrated at a preliminary processing stage. Wafer fragment 10 comprises a substrate (or base) 14. Substrate 14 can comprise, for example, monocrystalline silicon lightly-doped with a background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A transistor device 16 is supported over substrate 14. Transistor device 16 comprises a gate 18 over the substrate, and a pair of source/drain regions 19 and 20 extending into the substrate. Gate 18 can comprise a conventional construction, and is shown comprising a bottom dielectric region 22, a conductive region 24, and an electrically insulative cap 26. Dielectric region 22 can comprise, for example, silicon dioxide, and can be referred to as gate oxide. Conductive region 24 can comprise, for example, one or more of metal, metal compounds, and conductively-doped silicon. Insulative cap 26 can comprise, for example, one or both of silicon nitride and silicon dioxide.

Source/drain regions 19 and 20 comprise heavily-doped deep regions 28, and lightly-doped shallow regions 30. Source/drain regions 19 and 20 can be formed utilizing conventional methods, and can be majority-doped with either n-type dopant or p-type dopant.

Electrically insulative sidewall spacers 32 are formed along sidewalls of transistor gate 18. Spacers 32 can be formed utilizing conventional methods, and can comprise, for example, one or both of silicon dioxide and silicon nitride.

An electrically insulative material 36 extends over substrate 14 and transistor gate 18. Insulative material 36 can comprise, for example, borophosphosilicate glass (BPSG).

An electrically conductive pedestal 38 extends upwardly from source/drain region 19, and electrically connects with source/drain region 19. Pedestal 38 can comprise, for example, one or more of metal, metal compounds, and conductively-doped silicon.

An opening 40 extends through insulative material 36 over pedestal 38. A conductive material 42 extends along an interior periphery of the opening, and electrically connects with an upper surface of pedestal 38. Conductive material 42 can comprise conventional materials utilized for storage nodes in capacitors, and can, for example, comprise conductively-doped silicon, one or more metals, and/or one or more metal compounds. Conductive material 42 has a surface 44 over which dielectric material is ultimately formed. Although surface 44 is shown as a smooth surface, it is to be understood that surface 44 can also be a rugged surface. For instance, material 42 can comprise hemispherical grain silicon. Although material 42 is shown as a single homogeneous layer, it is to be understood that material 42 can comprise multiple layers. For instance, material 42 can comprise an underlying layer of silicon, which in turn is covered by a metal nitride, such as, for example, tantalum nitride, tungsten nitride and/or titanium nitride. Accordingly, surface 44 can comprise a metal nitride, and in particular aspects will comprise one or more of tantalum nitride, tungsten nitride and titanium nitride. Conductive material 42 can comprise any suitable material, and in particular aspects will comprise one or more of Pt, Co, Ni, Ru and Pd. If metals are present in material 42, the metals can be, for example, in elemental form, metal compound form, and/or in the form of various alloys.

Conductive material 42 can be formed utilizing conventional methods, such as, for example, one or more of chemical vapor deposition, atomic layer deposition, sputter deposition, etc. Material 42 can be patterned into the shown configuration by, for example, forming material 42 initially over an entirety of an upper surface of mass 36 and within opening 40, and subsequently utilizing polishing (such as, for example, chemical-mechanical polishing) to remove material 42 from over the upper surface of mass 36 while leaving the material remaining within opening 40.

A first hafnium-containing material 50 is formed over a surface of mass 36 and within opening 40. First hafnium-containing material 50 can be referred to as a seed material, and preferably is substantially crystalline (i.e., is at least 95% crystalline, by volume) and in a desired crystallographic orientation. For instance, if material 50 comprises, consists essentially of, or consists of hafnium oxide, it can be preferred that the material be in a non-leaky crystallographic orientation. Accordingly, it can be preferred that material 50 be in a non-monoclinic crystallographic orientation, with desired crystallographic orientations being, for example, the tetragonal orientation and the orthorhombic orientation.

Hafnium-containing material 50 is shown formed physically against upper surface 44 of conductive mass 42.

Accordingly, if upper surface 44 comprises one or more of tantalum nitride, tungsten nitride and titanium nitride, hafnium-containing material 50 can be considered to be formed directly against the one or more of tantalum nitride, tungsten nitride and titanium nitride of such surface. It is to be understood, however, that an intervening dielectric material can be present between hafnium-containing material 50 and conductive material 42. For instance, if the conductive material comprises conductively-doped silicon, a thin layer (less than 20 Å thick) of silicon dioxide, silicon nitride or silicon oxynitride can be present on the silicon prior to formation of hafnium-containing material.

Hafnium-containing material 50 can be formed utilizing appropriate reaction conditions for forming the material in a desired crystalline phase and orientation. For instance, if hafnium-containing material 50 is hafnium oxide, and if the desired crystallographic orientation is tetragonal, layer 50 can be formed in an ALD and/or CVD process by exposing a hafnium chloride reactant (such as, for example, $HfCl_4$) to a temperature of at least about 350° C. in the presence of water; or by exposing a hafnium-containing metal organic reactant (such as, for example, tetrakis dimethylhafnium or methylethyl tetrakis amidohafnium) to a temperature of at least about 350° C. in the presence of ozone.

Methods utilized for forming hafnium oxide in a tetragonal crystallographic orientation tend to be relatively slow. Accordingly it is typically desired that material 50 be formed relatively thin, since the formation of material 50 can be one of the slower steps in fabrication of a device. An exemplary thickness for material 50 is from about 5 Å to about 20 Å.

Figure 2:
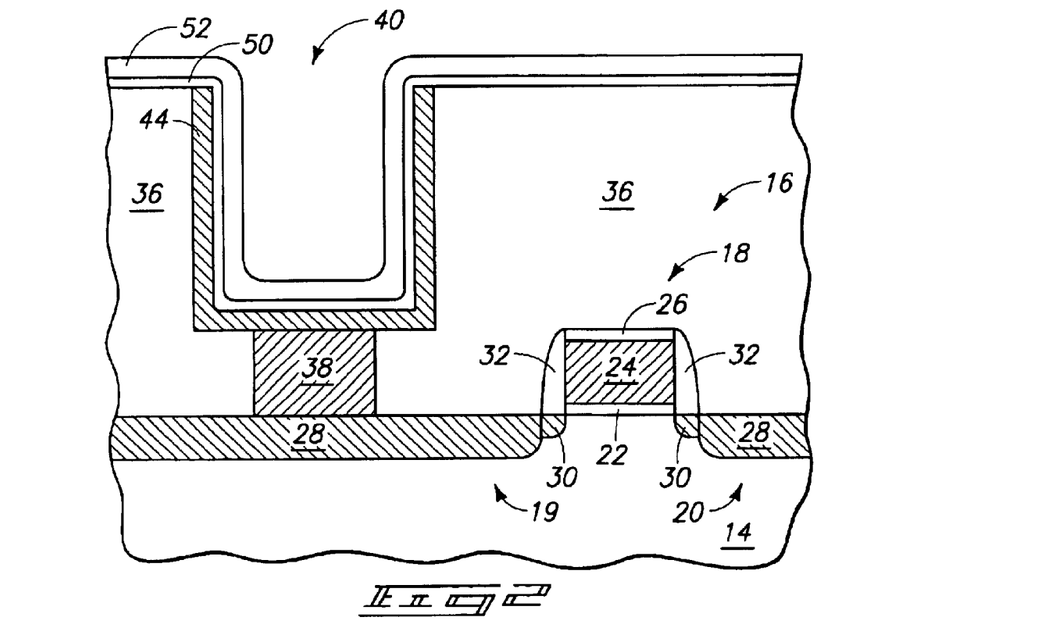
FIG. 2 is a view of the FIG. 1 wafer fragment shown at a processing stage subsequent to that of FIG. 1.

Referring to FIG. 2, a second hafnium-containing material 52 is formed over and physically against the first hafnium-containing material 50. Second hafnium-containing material 52 can, for example, comprise, consist essentially of, or consist of hafnium oxide. Second hafnium-containing material 52 is in a different crystalline phase and/or orientation from first hafnium-containing material 50. In particular aspects, second hafnium-containing material 52 can be in a substantially amorphous phase (with the term "substantially amorphous" indicating that at least 95% (by volume) of material 52 is amorphous, or, in other words, that no more than 5% of material 52 is crystalline). In some aspects, material 52 can be entirely in an amorphous phase. If the difference between hafnium-containing materials 50 and 52 is an amount of crystalline phase between materials 50 and 52 (e.g., material 50 can be entirely crystalline and material 52 can be substantially amorphous), then, to the extent that material 52 comprises any crystalline composition therein, the crystalline composition can be in the same crystallographic orientation as the hafnium-containing material 50, or a different orientation.

In another aspect, layers 52 and 50 can both be predominately crystalline (i.e., can both be more than 50% crystalline, by volume), but have different crystallographic orientations relative to one another. For instance, crystalline material of layer 50 can be substantially entirely in a tetragonal crystallographic orientation, and crystalline material of layer 52 can be substantially entirely in a monoclinic crystallographic orientation.

In particular aspects of the invention, materials 50 and 52 both comprise, consist essentially of, or consist of hafnium oxide. Layer 50 is formed as a crystalline material having predominately, and in some aspects entirely, a tetragonal crystallographic orientation. In contrast, hafnium oxide-containing material 52 is formed as a substantially amorphous material. Hafnium oxide-containing material 50 can be referred to as a first hafnium oxide-containing material, and hafnium oxide-containing material 52 can be referred to as a second hafnium oxide-containing material. The material 50 can be considered a seed layer which is ultimately utilized to induce a desired crystallographic phase and orientation in material 52 (discussed below).

Second hafnium-containing material 52 can be formed, for example, from a hafnium-containing metal organic reactant exposed to a temperature of from about 150° C. to about 250° C. during formation of layer 52, with particular temperatures being less than 200° C., and with a typical temperature being about 180° C. The hafnium-containing metal organic reactant can comprise, consist essentially of, or consist of, for example, tetrakis dimethylhafnium or methylethyl tetrakis amidohafnium. The hafnium-containing metal organic precursor can be utilized in an ALD and/or CVD process in combination with ozone to form hafnium oxide-containing material 52.

Layer 52 can be formed to a thickness greater than 20 Å, and typically will be formed to a thickness of, for example, from about 20 Å to about 100 Å. Although only a single layer 52 is shown, it is to be understood that multiple layers of hafnium oxide-containing material can be formed over layer 50, and in particular aspects all of the multiple layers will have a different crystallographic phase and/or orientation from layer 50.

After formation of layer 52, layer 50 is utilized to induce desired crystallographic properties into layer 52. For instance, if layer 50 comprises a tetragonal crystallographic orientation and layer 52 does not (either due to layer 52 being crystalline but in the wrong orientation, or due to layer 52 being amorphous), subsequent processing can be utilized to induce the tetragonal crystallographic orientation into layer 52. Such subsequent processing can include, for example, exposing layers 50 and 52 to a temperature of at least about 350° C., more typically of at least about 400° C. and frequently of at least about 600° C., with a typical temperature being about 625° C. The thermal processing of layers 50 and 52 can be conducted in a furnace, with layers 50 and 52 held at the desired temperature (such as, for example, a temperature of about 625° C.) for a time of at least about 1 hour. Layer 52 can be exposed to an oxidizing atmosphere during such thermal processing (with a suitable oxidant comprising, for example, diatomic oxygen ($O_2$)), or to an atmosphere which is inert relative to reaction with layer 52 (with a suitable inert atmosphere consisting essentially of or consisting of, for example, one or more of nitrogen ($N_2$), or, argon (Ar)). Alternatively, the thermal processing of layers 50 and 52 can comprise rapid thermal processing with a ramp rate of, for example, at least about 50° C./minute, and with the desired temperature maintained for a time of, for example, at least about 1 minute. A surface of layer 52 can be exposed to an oxidizing atmosphere, or an inert atmosphere, during the rapid thermal processing.

An advantage of the two step processing of the present invention (with the two steps being deposition of the hafnium-containing materials 50 and 52, and the thermal processing to induce crystallographic changes in material 52) is that such can form hafnium-containing materials in a desired crystallographic phase more rapidly than can prior art processes. Specifically, processing of the present invention can form a hafnium-containing material having a thickness of greater than 25 Å, and typically from about 25 Å to about 120 Å (the combined thickness of layers 50 and 52), and having a desired crystallographic phase and orientation, while taking advantage of the more rapid processing by which hafnium-containing materials can be formed in an amorphous phase relative to the slow processing by which hafnium-containing materials are deposited in a tetragonal crystallographic orientation. In particular aspects, the present invention utilizes the slower deposition for forming a relatively thin seed layer (50) having a desired crystalline phase and orientation, and then utilizes the rapid deposition for forming the bulk of the hafnium-containing material (52). In subsequent processing, layer 52 is converted to the desired crystallographic phase and orientation utilizing layer 50. Accordingly, an entirety of the hafnium-containing material (the combined layers 50 and 52) will have the desired phase and orientation, even though the majority of the material was initially formed in a non-desired phase and/or orientation by relatively rapid processing.

Another advantage of methodology of the present invention is that the methodology can utilize relatively weak oxidizing conditions for forming the lower portion of a hafnium oxide-containing dielectric material, while utilizing stronger oxidizing conditions for forming the majority of the dielectric material. Specifically, seed layer 50 can be formed from a hafnium chloride precursor in combination with water, which can be weak enough oxidizing conditions to avoid oxidizing an upper surface of conductive material 44. For example, if the upper surface of material 44 comprises a metal nitride (such as, for example, one or more of tantalum nitride, tungsten nitride and titanium nitride), strongly oxidizing conditions could detrimentally affect the conductivity of such upper surface. However, the weakly oxidizing conditions utilized for forming layer 50 can be conducted over a metal nitride-containing surface with little, if any, oxidation of the surface. Once that layer 50 is formed over the surface, the deposition conditions for forming the remaining hafnium oxide-containing material (52) can be changed to strongly oxidizing conditions, and layer 50 can be utilized as a protective barrier over the upper surface of conductive mass 44. The strongly oxidizing conditions utilized to form bulk material 52 can comprise, for example, utilization of ozone ($O_3$) in combination with a hafnium-containing metal organic precursor.

The deposition of layer 52 can be conducted in the same reaction chamber utilized for deposition of layer 50. However, since a fluctuation in temperature is utilized in various aspects of the invention (for instance, if layers 50 and 52 comprise hafnium oxide-containing materials, layer 50 will typically be formed at a temperature of at least about 350° C., whereas layer 52 will be formed at a temperature of less than or equal to about 250° C.), it can be desired that a reaction chamber utilized for deposition of both layers 50 and 52 be configured to allow the desired fluctuation in temperature. In other aspects, layers 50 and 52 can be deposited in different reaction chambers relative to one another.

Although the two-step process described above induces desired crystallographic properties into layer 52 from layer 50 in a separate step occurring after formation of layer 52, it is to be understood that at least some desired crystallographic properties can be induced into layer 52 from layer 50 during formation of layer 52.

Figure 3:
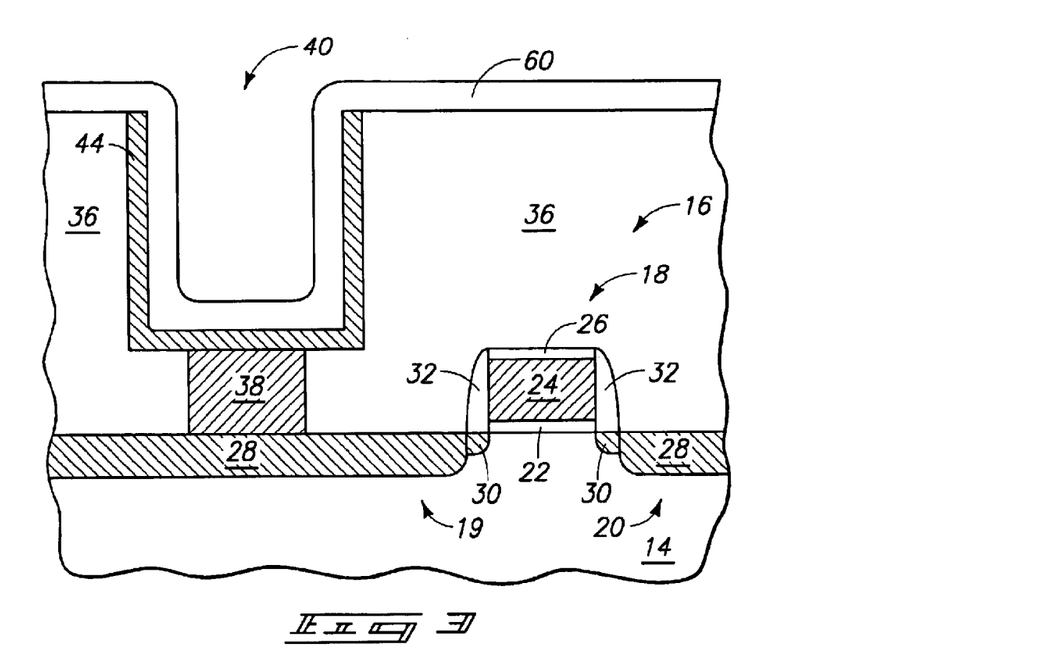
FIG. 3 is a view of the FIG. 1 wafer fragment shown at a processing stage subsequent to that of FIG. 2.

FIG. 3 shows construction 10 after layer 50 (FIG. 2) has been utilized to induce a desired change in crystallographic phase in layer 52 (FIG. 2), and accordingly shows a single dielectric material 60 comprising the layers 50 and 52. The construction shown in FIG. 3 assumes that layers 50 and 52 had a common composition relative to one another, and differed only in crystallographic phase and/or orientation. Thus, the layers 50 and 52 merge to form a single homogeneous layer 60 when crystallographic properties of layer 52 are altered to match those of layer 50. It is to be understood that the invention encompasses other aspects (not shown) in which layers 50 and 52 differ in composition as well as in crystallographic properties.

Figure 4:
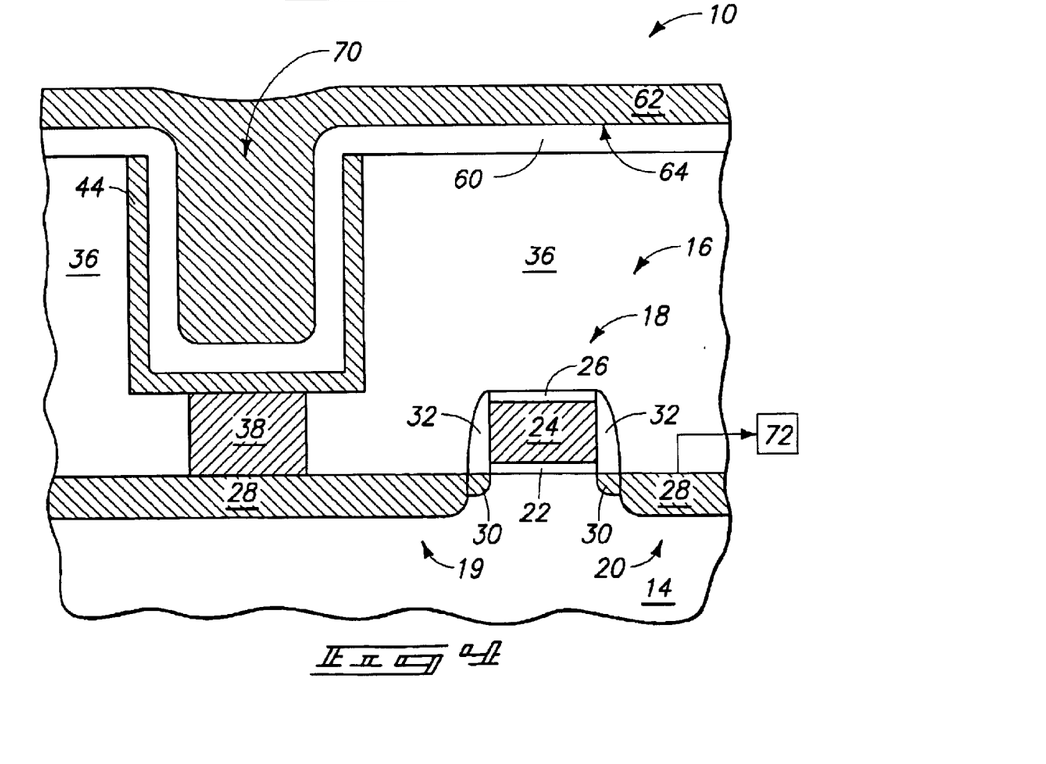
FIG. 4 is a view of the FIG. 1 wafer fragment shown at a processing stage subsequent to that of FIG. 3.

Referring to FIG. 4, a conductive material 62 is formed over dielectric material 60. Conductive material 62 can comprise, for example, one or more of metal, metal compounds and conductively-doped silicon. Layer 62 is shown having a surface 64 directly against dielectric material 60. In particular aspects, surface 64 will comprise, consist essentially of, or consist of one or more metal nitrides (such as, for example, one or more of titanium nitride, tungsten nitride and tantalum nitride). Conductive material 62 can comprise any suitable material, and in particular aspects will comprise one or more of Pt, Co, Ni, Ru and Pd. If metals are present in material 62, the metals can be, for example, in elemental form, metal compound form, and/or in the form of various alloys.

Layers 44, 60 and 62 together define a capacitor construction 70. Specifically, layer 44 can be considered a first capacitor electrode, and layer 62 can be considered a second capacitor electrode separated from the first electrode by dielectric material 60. In particular aspects, dielectric material 60 comprises, consists essentially of, or consists of hafnium oxide, and an entirety of the dielectric material between electrodes 44 and 62 is the hafnium oxide-containing material 60. Further, if layer 60 comprises, consists essentially of, or consists of hafnium oxide, the hafnium oxide can be, in particular applications, substantially entirely, or entirely, in the tetragonal crystallographic orientation (with the term "substantially entirely" indicating that at least 95 volume percent of the hafnium oxide-containing material is in the stated tetragonal crystallographic orientation).

Although second capacitor electrode 62 is shown formed over dielectric material 60 after thermal processing of layers 50 and 52 (FIG. 2) to induce a desired crystallographic phase change in layer 52, it is to be understood that the thermal processing of layers 50 and 52 could alternatively occur during and/or after formation of conductive material 62. Also, although conductive material 62 is shown as a single homogeneous layer, it is to be understood that mass 62 could also comprise multiple layers of suitable electrically conductive compositions.

Capacitor 70 can be incorporated into a memory device, such as, for example, a dynamic random access memory (DRAM) device. In the shown aspects of the invention, capacitor 70 is electrically connected with source/drain region 19 of transistor device 16. The other source/drain region 20 can be electrically connected to a bitline 72, as shown. The electrical connection of source/drain region 20 to bitline 72 can occur after formation of capacitor 70, or alternatively can occur prior to, or during, formation of capacitor 70.

A circuit device comprising hafnium-containing material formed in accordance with methodology of the present invention (such as the above-described DRAM cell) can be utilized in numerous assemblies, including, for example, computer systems and other electronic systems.

Figure 5:
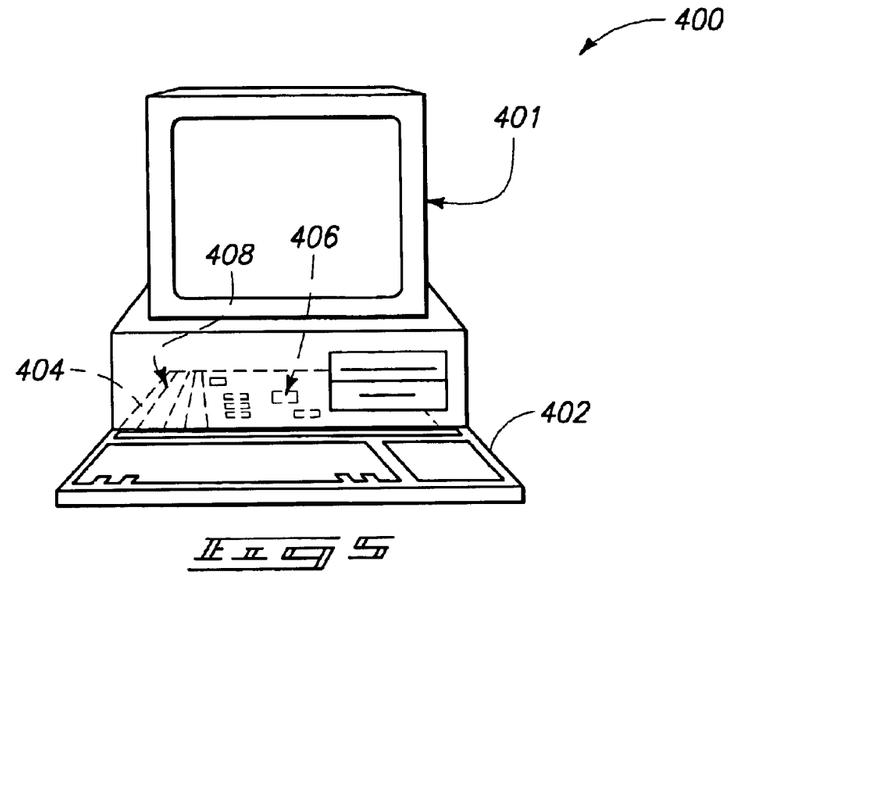
FIG. 5 is a diagrammatic view of a computer illustrating an exemplary application of the present invention.

FIG. 5 illustrates generally, by way of example, but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above, including, for example, the DRAM unit cell described with reference to FIG. 4. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 6. In such block diagram, the addressing circuitry is illustrated as 410 and the read circuitry is illustrated as 412.

Figure 6:
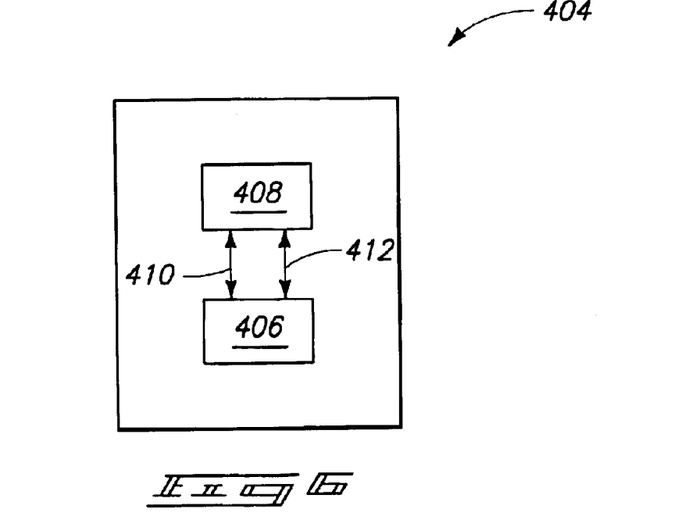
FIG. 6 is a block diagram showing particular features of the motherboard of the FIG. 5 computer.

In particular aspects of the invention, memory device 408 can correspond to a memory module. For example, single in-line memory modules (SIMMs) and dual in-line memory modules (DIMMs) may be used in the implementation which utilizes the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

Figure 7:
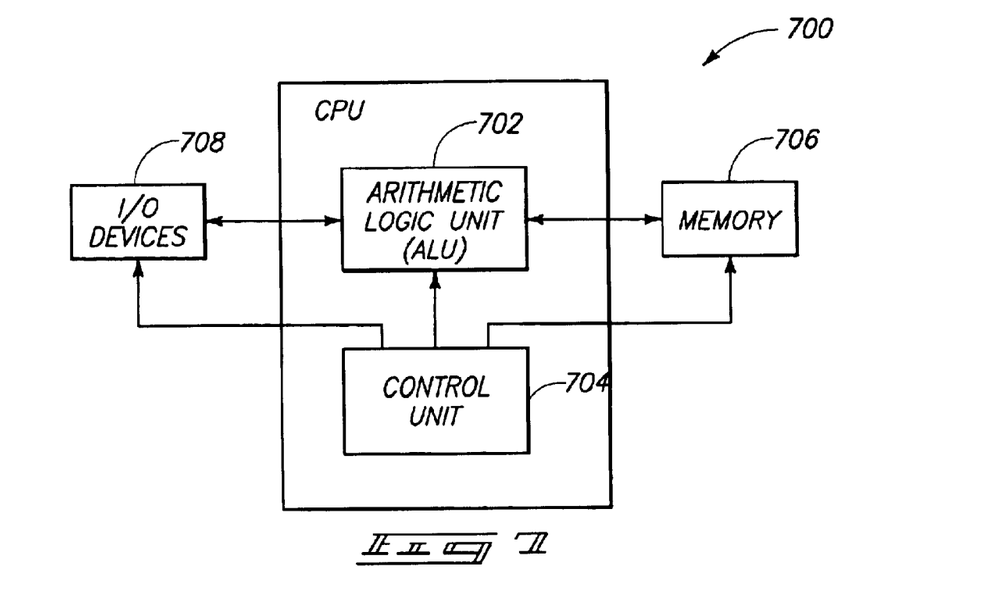
FIG. 7 is a high-level block diagram of an electronic system according to an exemplary aspect of the present invention.

FIG. 7 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include DRAM cells in accordance with various aspects of the present invention.

Figure 8:
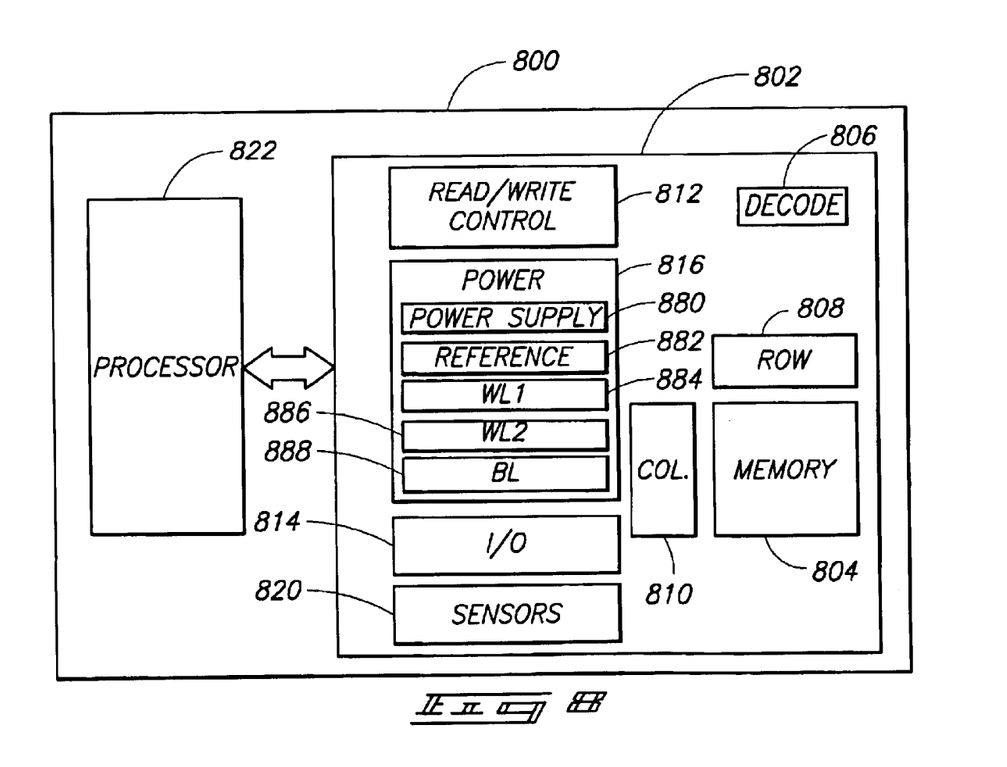
FIG. 8 is a simplified block diagram of an exemplary electronic system according to an aspect of the present invention.

FIG. 8 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. The system 800 also includes a processor 822, or memory controller for memory accessing.

The memory device 802 receives control signals 824 from the processor 822 over wiring or metallization lines. The memory device 802 is used to store data which is accessed via I/O lines. It will be appreciated by those skilled in the art that additional circuitry and control signals can be provided, and that the memory device 802 has been simplified to help focus on the invention. At least one of the processor 822 or memory device 802 can include a DRAM cell of the type described previously in this disclosure.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of ordinary skill in the art will understand that the various electronic systems can be fabricated in single-package processing units, or even on a single semiconductor chip, in order to reduce the communication time between the processor and the memory device (s).

Applications for memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method for forming hafnium-containing materials, comprising:

providing a semiconductor substrate;

utilizing first reaction conditions to form hafnium-containing seed material in a desired crystallographic orientation over the substrate; the desired crystallographic orientation predominately including one or more crystallographic orientations other than a monoclinic orientation;

utilizing second reaction conditions different from the first reaction conditions to grow second hafnium-containing material over the seed material; and utilizing the seed material to induce the desired crystallographic orientation in the second hafnium-containing material.

2. The method of claim 1 wherein the desired crystallographic orientation is a tetragonal orientation.

3. The method of claim 1 wherein the second hafnium-containing material is grown in a substantially amorphous phase, and wherein the seed material is utilized to induce both a crystalline phase in the second hafnium-containing material and the desired crystallographic orientation in the second hafnium-containing material.

4. The method of claim 1 wherein the seed material is utilized to induce the desired crystallographic orientation in the second hafnium-containing material after growing the second hafnium-containing material.

5. The method of claim 1 wherein the hafnium-containing seed material consists essentially of hafnium oxide.

6. The method of claim 5 wherein the first reaction conditions comprise utilizing a hafnium chloride reactant to form the hafnium oxide-containing seed material.

7. The method of claim 6 wherein the first reaction conditions comprise exposing the hafnium chloride reactant to a temperature of at least about 350° C. during formation of the hafnium oxide-containing seed material.

8. The method of claim 5 wherein the first reaction conditions comprise utilizing a hafnium-containing metal organic reactant to form the hafnium oxide-containing seed material.

9. The method of claim 8 wherein the hafnium-containing metal organic reactant comprises tetrakis dimethyl hafnium or methylethyl tetrakis amidohafnium.

10. The method of claim 8 wherein the first reaction conditions comprise exposing the hafnium-containing metal organic reactant to a temperature of at least about 350° C. during formation of the hafnium oxide-containing seed material.

11. The method of claim 5 wherein the second hafnium-containing material consists essentially of hafnium oxide.

12. The method of claim 11 wherein the second reaction conditions comprise:
  growing the hafnium oxide of the second hafnium-containing material from a hafnium-containing metal organic reactant while exposing the reactant to a temperature of less than or equal to about 250° C.; and
  after growing the hafnium oxide of the second-hafnium-containing material, exposing the hafnium oxide of the second hafnium-containing material and the hafnium oxide of the hafnium-containing seeds to a temperature of at least about 350° C. to induce the desired crystallographic orientation in the hafnium oxide of the second hafnium-containing material.

13. The method of claim 12 wherein the temperature utilized to induce the desired crystallographic orientation in the hafnium oxide of the second hafnium-containing material is at least about 400° C.

14. The method of claim 12 wherein the temperature utilized to induce the desired crystallographic orientation in the hafnium oxide of the second hafnium-containing material is at least about 600° C.

15. A method for forming hafnium oxide, comprising:
  providing a semiconductor substrate;
  forming first hafnium oxide-containing material over the substrate, the first hafnium oxide-containing material predominately having a tetragonal crystallographic orientation;
  forming second hafnium oxide-containing material over the first hafnium oxide-containing material, the second hafnium oxide-containing material being substantially amorphous; and
  utilizing the first hafnium oxide-containing material to induce the tetragonal crystallographic orientation in the second hafnium oxide-containing material.

16. The method of claim 15 wherein the first hafnium oxide-containing material has a thickness of from about 5 Å to about 20 Å.

17. The method of claim 16 wherein the second hafnium oxide-containing material has a thickness of greater than about 20 Å.

18. The method of claim 15 wherein the first hafnium oxide-containing material is formed from a hafnium chloride reactant.

19. The method of claim 15 wherein the first hafnium oxide-containing material is formed from a hafnium-containing metal organic reactant.

20. The method of claim 15 wherein the second hafnium oxide-containing material is formed from a hafnium-containing metal organic reactant while exposing the reactant to a temperature of less than or equal to about 250° C.

21. The method of claim 15 wherein a temperature of the second hafnium oxide-containing material during the inducing of the tetragonal crystallographic orientation in the second hafnium oxide-containing material is at least about 400° C.

22. The method of claim 15 wherein a temperature of the second hafnium oxide-containing material during the inducing of the tetragonal crystallographic orientation in the second hafnium oxide-containing material is at least about 600° C.

23. The method of claim 22 wherein the temperature of at least about 600° C. is maintained for at least about one hour.

24. The method of claim 22 wherein the temperature of at least about 600° C. is achieved by rapid thermal processing at a rate of at least about 50° C./minute and is maintained for at least about one minute.

25. The method of claim 15 wherein the first hafnium oxide-containing material consists essentially of hafnium oxide.

26. The method of claim 15 wherein the second hafnium oxide-containing material consists essentially of hafnium oxide.

27. The method of claim 15 wherein the substrate includes a surface comprising one or more of tantalum nitride, tungsten nitride and titanium nitride; and wherein the first hafnium oxide-containing material is formed directly against the one or more of tantalum nitride, tungsten nitride and titanium nitride of the surface.

28. The method of claim 15 wherein the second hafnium oxide-containing material is formed over a first capacitor electrode, and further comprising forming a second capacitor electrode over the second hafnium oxide-containing material.

29. The method of claim 28 wherein the second capacitor electrode is formed after utilizing the first hafnium oxide-containing material to induce the tetragonal crystallographic orientation in the second hafnium oxide-containing material.

30. The method of claim 28 wherein the only dielectric material between the first and second capacitor electrodes is the first and second hafnium oxide-containing materials.

31. A method of forming hafnium oxide, comprising:
  providing a semiconductor substrate;
  forming a first hafnium oxide-containing material from a first hafnium-containing precursor utilizing a temperature of greater than or equal to 350° C.; and
  forming a second hafnium oxide-containing material directly against the first hafnium oxide-containing material from a second hafnium-containing precursor utilizing a temperature of less than or equal to 250° C.

32. The method of claim 31 wherein the second hafnium-containing precursor is the same as the first hafnium-containing precursor.

33. The method of claim 31 wherein the temperature utilized during formation of the second hafnium oxide-containing material is from about 150° C. to about 250° C.

34. The method of claim 31 wherein the first hafnium-containing precursor is a hafnium chloride reactant.

35. The method of claim 31 wherein the first hafnium-containing precursor is a hafnium-containing metal organic reactant.

36. The method of claim 35 wherein the hafnium-containing metal organic reactant comprises tetrakis dimethylhafnium or methylethyl tetrakis amidohafnium.

37. The method of claim 31 wherein the second hafnium-containing precursor is a hafnium-containing metal organic reactant.

38. The method of claim 37 wherein the hafnium-containing metal organic reactant comprises tetrakis dimethylhafnium or methylethyl tetrakis amidohafnium.

39. The method of claim 31 wherein the first hafnium oxide-containing material has a substantially crystalline phase and has crystallographic orientation, wherein the second hafnium oxide-containing material has a different phase than the first hafnium oxide-containing material; and further comprising inducing a crystallographic phase change within the second hafnium oxide-containing material to cause the second hafnium oxide-containing material to adopt the crystallographic phase and orientation of the first hafnium oxide-containing material; the inducing the crystallographic phase change comprising heating the second hafnium oxide-containing material to a temperature of at least about 400° C.

40. The method of claim 39 wherein the second hafnium oxide-containing material is formed over a first capacitor electrode, and further comprising forming a second capacitor electrode over the second hafnium oxide-containing material.

41. The method of claim 40 wherein the second capacitor electrode is formed after utilizing the first hafnium oxide-containing material to induce the crystallographic phase change in the second hafnium oxide-containing material.

42. The method of claim 40 wherein the only dielectric material between the first and second capacitor electrodes is the first and second hafnium oxide-containing materials.

43. The method of claim 39 wherein the temperature of the second hafnium oxide-containing material during the inducing of the phase change in the second hafnium oxide-containing material is at least about 600° C.

44. The method of claim 31 wherein the first hafnium oxide-containing material consists essentially of hafnium oxide.

45. The method of claim 31 wherein the second hafnium oxide-containing material consists essentially of hafnium oxide.

46. The method of claim 31 wherein the substrate comprises a surface comprising one or more of tantalum nitride, tungsten nitride and titanium nitride; and wherein the first hafnium oxide-containing material is formed directly against the one or more of tantalum nitride, tungsten nitride and titanium nitride of the surface.

47. A capacitor construction, comprising:
a semiconductor substrate;
a first capacitor electrode over the semiconductor substrate;
a second capacitor electrode over the first capacitor electrode; and
a dielectric material between the first and second capacitor electrodes; an entirety of the dielectric material between the first and second electrodes consisting essentially of crystalline hafnium oxide having a non-monoclinic crystallographic orientation.

48. The capacitor construction of claim 47 wherein the entirety of the dielectric material between the first and second electrodes consists of the crystalline hafnium oxide having the non-monoclinic crystallographic orientation.

49. The capacitor construction of claim 47 wherein the dielectric material between the first and second electrodes has a thickness greater than 25 Å.

50. The capacitor construction of claim 47 wherein the non-monoclinic crystallographic orientation is a tetragonal crystallographic orientation.

51. The capacitor construction of claim 47 wherein the first capacitor electrode comprises titanium nitride, and wherein the hafnium oxide of the dielectric material is directly against the titanium nitride of the first capacitor electrode.

52. The capacitor construction of claim 47 wherein the first capacitor electrode comprises tantalum nitride, and wherein the hafnium oxide of the dielectric material is directly against the tantalum nitride of the first capacitor electrode.

53. The capacitor construction of claim 47 wherein the first capacitor electrode comprises tungsten nitride, and wherein the hafnium oxide of the dielectric material is directly against the tungsten nitride of the first capacitor electrode.

54. The capacitor construction of claim 47 wherein the second capacitor electrode comprises titanium nitride, and wherein the hafnium oxide of the dielectric material is directly against the titanium nitride of the second capacitor electrode.

55. The capacitor construction of claim 47 wherein the second capacitor electrode comprises tantalum nitride, and wherein the hafnium oxide of the dielectric material is directly against the tantalum nitride of the second capacitor electrode.

56. The capacitor construction of claim 47 wherein the second capacitor electrode comprises tungsten nitride, and wherein the hafnium oxide of the dielectric material is directly against the tungsten nitride of the second capacitor electrode.

57. The capacitor construction of claim 47 wherein:
the first capacitor electrode comprises titanium nitride;
the hafnium oxide of the dielectric material is directly against the titanium nitride of the first capacitor electrode;
the second capacitor electrode comprises titanium nitride; and
the hafnium oxide of the dielectric material is directly against the titanium nitride of the second capacitor electrode.

58. The capacitor construction of claim 47 wherein:
the first capacitor electrode comprises tantalum nitride;
the hafnium oxide of the dielectric material is directly against the tantalum nitride of the first capacitor electrode;

the second capacitor electrode comprises tantalum nitride; and the hafnium oxide of the dielectric material is directly against the tantalum nitride of the second capacitor electrode.

59. The capacitor construction of claim 47 wherein:

the first capacitor electrode comprises tungsten nitride;

the hafnium oxide of the dielectric material is directly against the tungsten nitride of the first capacitor electrode;

the second capacitor electrode comprises tungsten nitride; and the hafnium oxide of the dielectric material is directly against the tungsten nitride of the second capacitor electrode.

60. A DRAM comprising the capacitor construction of claim 47.

61. An electronic system comprising the DRAM of claim 60.

* * * * *

UNITED STATES PATENT AND TRADEMARK OFFICE
CERTIFICATE OF CORRECTION

PATENT NO. : 6,785,120 B1
DATED : August 31, 2004
INVENTOR(S) : Cem Basceri et al.

It is certified that error appears in the above-identified patent and that said Letters Patent is hereby corrected as shown below:

<u>Column 5,</u>
Line 19, replace "a hafnium chloride reactant (such as, for example, $HfCI_4$) to" with -- a hafnium chloride reactant (such as, for example, $HfCl_4$) to --

Signed and Sealed this

Fifth Day of April, 2005

JON W. DUDAS
*Director of the United States Patent and Trademark Office*